(12) United States Patent
Onishi et al.

(10) Patent No.: US 7,619,357 B2
(45) Date of Patent: Nov. 17, 2009

(54) ELECTROLUMINESCENT DISPLAY DEVICE

(75) Inventors: Yasuharu Onishi, Tokyo (JP); Satoru Toguchi, Tokyo (JP); Junichi Yamanari, Kanagawa (JP); Hitoshi Ishikawa, Tokyo (JP); Tomohisa Gotoh, Tokyo (JP); Atsushi Kamijo, Tokyo (JP)

(73) Assignee: Samsung Mobile Display Co., Ltd., Yongin (KR)

( * ) Notice: Subject to any disclaimer, the term of this patent is extended or adjusted under 35 U.S.C. 154(b) by 9 days.

(21) Appl. No.: 10/851,251

(22) Filed: May 24, 2004

(65) Prior Publication Data

US 2005/0077820 A1    Apr. 14, 2005

(30) Foreign Application Priority Data

May 22, 2003    (JP)    ............... 2003-144769

(51) Int. Cl.
*H05B 33/12*    (2006.01)
(52) U.S. Cl. .................. 313/506; 313/110; 313/112
(58) Field of Classification Search ............... 313/110, 313/512, 505, 506, 112
See application file for complete search history.

(56) References Cited

U.S. PATENT DOCUMENTS

| | | | | |
|---|---|---|---|---|
| 6,476,550 | B1 * | 11/2002 | Oda et al. | ............. 313/504 |
| 6,906,452 | B2 * | 6/2005 | Ichikawa | ............. 313/110 |
| 6,911,674 | B2 * | 6/2005 | Evans | ............. 257/83 |
| 2002/0180348 | A1 | 12/2002 | Oda et al. | |
| 2004/0012980 | A1 | 1/2004 | Sugiura et al. | |

FOREIGN PATENT DOCUMENTS

| | | |
|---|---|---|
| CN | 1236486 | 6/2004 |
| CN | 1343011 | 9/2007 |
| EP | 1085582 | 3/2001 |
| EP | 1387406 | 2/2004 |
| EP | 1435762 | 7/2004 |
| JP | 62-172691 A1 | 7/1987 |
| JP | 63-314795 A1 | 12/1988 |
| JP | 01-220394 A1 | 9/1989 |
| JP | 08-083688 | 3/1996 |
| JP | 11-008070 | 1/1999 |
| JP | 11-283751 | 10/1999 |
| JP | 11-329742 | 11/1999 |
| JP | 2000-284726 | 10/2000 |
| JP | 2001-060495 A1 | 3/2001 |
| JP | 2002-131495 | 5/2002 |
| JP | 2002-260845 A1 | 9/2002 |
| JP | 2003-007450 | 1/2003 |
| JP | 2003-086353 | 3/2003 |
| JP | 2003-109749 | 4/2003 |
| KR | 10-2003-0029467 | 4/2003 |
| WO | 00-36664 | 6/2000 |
| WO | 02-35890 | 5/2002 |
| WO | 02-37580 | 5/2002 |
| WO | 03-026357 | 3/2003 |
| WO | 2004-084323 | 9/2004 |

OTHER PUBLICATIONS

C.W. Tang, et al., "Organic electroluminescent diodes", Applied Physics Letters, vol. 51, Sep. 21, 1987, pp. 913-915.
Tetsuo Tsutsui, "The Phenomenon and trend of an organic eletroluminescence", Monthly Display, vol. 1, No. 3, Sep. 1995, pp. 11-16.
European Search Report dated Jul. 5, 2007.

* cited by examiner

*Primary Examiner*—Nimeshkumar D. Patel
*Assistant Examiner*—Anthony T Perry
(74) *Attorney, Agent, or Firm*—H.C. Park & Associates, PLC

(57)    ABSTRACT

The present invention relates to an organic electroluminescent device. There is provided an organic electroluminescent device with a good luminescence property and high luminous efficiency in which the organic electroluminescent device has a diffraction grating 2 on the surface of the substrate 1 and an organic EL layer 5 including an emission layer between an anode 4 an a cathode 6 via an intermediate layer 3.

11 Claims, 6 Drawing Sheets

ELECTROLUMINESCENT DISPLAY DEVICE

CROSS-REFERENCE TO RELATED APPLICATION

This application claims the benefit of Japanese Patent Application No. 2003-144769, filed May 22, 2003, the disclosure of which is hereby incorporated herein by reference in its entirety.

BACKGROUND OF THE INVENTION

1. Field of the Invention

The present invention relates to an organic electroluminescent device having a good luminescent state and excellent luminous efficiency.

2. Description of the Related Art

The organic electroluminescent device (hereinafter, organic EL device) is an emissive device using a principle in which a fluorescent material emits light using recombination energy of holes injected from an anode and electrons injected from a cathode by electric field application. A representative example of a study on this organic EL device includes a low voltage driving organic EL device using a stacked device, which has been reported by C. W. Tang et al (e.g., see C. W. Tang, S. A. VanSlyke, Applied Physics Letters), Vol. 51, p913, 1987, etc.). With the development of this stacked device, the luminescence property of the organic EL device was significantly enhanced. And, as this high performance organic EL device has been developed, in recent, study and development on the organic EL device have been actively made to practically use it.

A two-layer structure by Tang et al. uses tris(8-quinolinol) aluminum (AlQ) for an emitting layer, and a triphenyldiamine derivative (TDP) for a hole transporting layer. This two-layer structure exhibits excellent characteristics because it has high efficiency in hole injection into the emitting layer, it further has high production efficiency of excitons formed through recombination by blocking the electrons injected from the cathode, and the formed excitons can be sealed in the emitting layer. Further, as an example of enhancing this two-layer structure, a three-layer structure of a hole transporting (injecting) layer, an emitting layer, and an electron transporting (injecting) layer has been reported. This three-layer structure has been known as a representative structure of an organic EL device along with the above-stated two-layer structure of the hole transporting (injecting) layer and the electron transportable emitting layer. Furthermore, what is needed in such a stacked device is to enhance the recombination efficiency of holes and electrons. To meet this need, numerous studies have been made.

By the way, because the organic EL device has a high response time and is an self-emissive device, the organic EL device is expected to be practically used as a high definition display for a portable terminal or a television set, but it is considered that it is necessarily required to enhance the light-emitting efficiency of an organic EL luminous body to realize a high definition organic EL display into products. Accordingly, a need to enhance the light-emitting efficiency of the organic EL device will be hereinafter described in detail.

First, considering a carrier recombination principle in the organic EL device, electrons and holes injected from an electrode to an emitting layer become electron-hole pairs by Coulomb's interaction in which some of the pairs become singlet excitons and the others form triplet excitons. The production ratio becomes 1:3 depending on quantum mechanical density. That is, if there is no phosphorescence observed from the triplet state, the quantum yield in luminescence becomes a maximum of 25%, which indicates that only the maximum efficiency of 25% is obtained from the organic EL device. Further, there is a problem with the organic EL device in that, because the refractive index of the luminous body affects the device, light at an exit angle larger than a critical angle causes total reflection and accordingly cannot be emitted to the exterior. That is, if the refractive index of the fluorescent substance is 1.6, only 20% of the total amount of emitted light is effective. Further, a summed production ratio of the above-stated singlet (production efficiency: 25%) becomes about 5% of the total, and the light-extraction efficiency of the organic EL device is significantly degraded (for example, see [The phenomenon and trend of an organic electroluminescence]) by Tetsuo Tsutsui: Monthly Display, Vol. 1, No. 3, p 11, September 1995). For this reason, it is necessarily required to enhance the light-extraction efficiency. Otherwise, such fatal degradation may be caused in the organic EL device.

Therefore, several methods have been studied aiming at developing technologies on an inorganic EL device as solutions for enhancing the light-emitting efficiency. Examples of such studies include a method for allowing a substrate to hold light focusing capability (for example, see Japanese Patent Laid-open No. Sho 63-314795) and a method for forming a reflective surface at a side of a device (for example, see Japanese Patent Laid-open No. Hei 1-220394).

Furthermore, as a conventional configuration, there is disclosed, in Japanese Patent Laid-open No. 2001-60495, an organic EL device sequentially comprising a substrate, a color filter layer, a barrier layer, a hole injecting electrode, an organic emitting layer, and an electron injecting electrode, wherein silicon oxide is normally used for the barrier layer. There is also disclosed, in Japanese Patent Laid-open No. 2002-260845, an organic EL device comprising an underlying layer of $SiO_2$ and the like formed over an entire surface of miniature lens, and an ITO film formed on the underlying layer.

However, the methods listed herein is usable for a large sized substrate, while it has a problem that, in a high definition display configured to have a very small pixel area, it is difficult to manufacture lens having a light focusing capability or to form a reflecting surface that is a side surface. And, in an organic EL device comprising an emitting layer with a thickness of several microns or less, it is very difficult to form a reflecting mirror on a side surface of the device even with a super fine processing technique, and the reflecting mirror may be formed but manufacturing cost significantly increases, which greatly obstructs a practical use.

Meanwhile, an example of introducing a flat layer, which is used for an anti-reflective film, having an intermediate value of respective refractive indexes of a substrate glass and a luminous body between the substrate glass and the luminous body has been reported, as a study example on a method different from the method having the light focusing capability and the method forming the reflecting surface at a side surface of the device (e.g., see Japanese Patent Laid-open No. Sho 62-172691). However, it is considered that forward light-emitting efficiency in this method may be enhanced but cannot prevent total reflection. That is, there is a problem with the principle of the anti-reflective film that even though the principle is effective in a luminous body with a large refractive index such as an inorganic EL, it cannot significantly enhance the light-emitting efficiency in an organic EL device that is a luminous body with a lower refractive index as compared to the inorganic EL device.

Although numerous studies on the light-emitting efficiency of the organic EL device have been reported as stated above, they do not yet meet desired performance, thus a countermeasure of a new concept is required.

Accordingly, as a new method that enhances the light-emitting efficiency, a study example in which an optical element such as a diffraction grating or the like is formed on a substrate (for example, see Japanese Patent Laid-open No. Sho 62-172691) has been reported. It is considered that this method is effective to enhance the light-emitting efficiency of the organic EL device. On the other hand, in case of the diffraction grating type organic EL device presented herein, high light emitting efficiency is possible but it is difficult to manufacture the device. In particular, even with up-to-date manufacturing techniques, it is difficult to accomplish a groove processing process in which a diffraction grating is buried, and a planarization technique in which a substrate is subject to the planarization prior to formation of a device, and also it is difficult to form electrodes on a substrate, suppress the deviation of luminescence property in a surface of a substrate.

SUMMARY OF THE INVENTION

Therefore, In view of the prior art problems, an object of the present invention is to provide an organic electroluminescent device having a good luminescence property and high luminous efficiency.

The present inventors have found, as a result of carefully conceiving the aforementioned object, that an organic electroluminescent device (hereinafter, referred to as organic EL device) can be stably fabricated with a good luminescence state and high luminous efficiency by disposing at least one organic layer including an emitting layer between an anode and a cathode via an intermediate layer over a substrate having an optical element thereon, the optical element being one of a diffraction grating, a scattering portion, a grating, and a polarizing filter.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
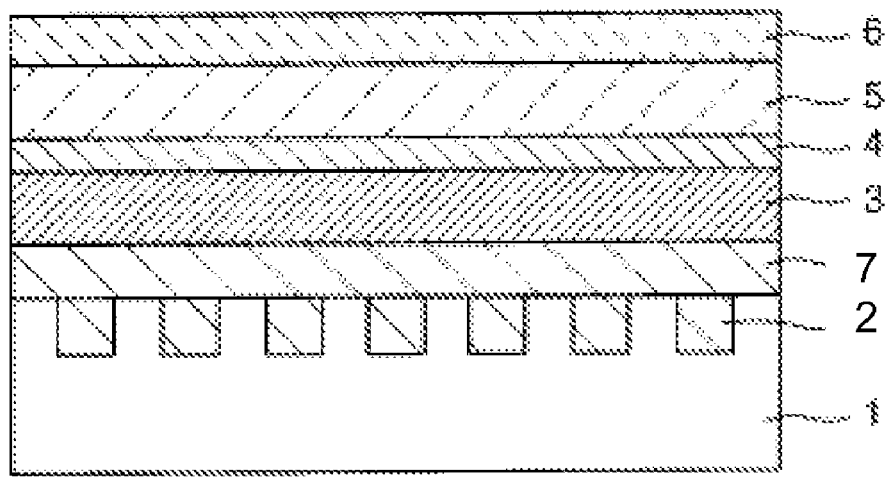
FIG. 1 is a configuration view of an organic electroluminescent device of the present invention.

Hereinafter, embodiments of the present invention will be described with reference to the accompanying drawings.

The organic EL device of the present invention comprises an intermediate layer over a substrate having an optical element thereon, the optical element being one of a diffraction grating, a scattering portion, a grating, and a polarizing filter; and at least one organic layer including an emitting layer between an anode and a cathode. In the present invention, the optical element is an element that quantitatively and stably affects diffraction, scatter, reflection, and refraction phenomenon of the light generated from an organic EL luminous body. An example of this optical element may include a diffraction grating, a scattering structure, a grating, lens, a color filter, a polarizing filter and the like. In the present invention, the diffraction grating is a device that obtains spectrum using the diffraction of light. The diffraction grating is an optical structure that has grooves dug periodically and uses a diffraction image caused by interference of lights reflected from a smooth surface between the grooves. The scattering structure is an optical structure that causes a scatter phenomenon, namely, a phenomenon that, when a wave (light) advancing in one direction reaches an obstacle, the light is expanded about the obstacle in several directions. The scattering structure can be formed by enabling particles, protrusions, or the like of materials with a different refraction index to be dispersed in a randomized form. Further, the lens is an isotropic homogeneous transparent body having one curved surface. It may be made by having the surface of a substrate or a film to be a curved shape. Meanwhile, the polarizing filter is an optical structure that causes a polarization phenomenon, namely, a phenomenon that components vibrating in mutually vertical directions in a plane perpendicular to a progress direction are mixed. A commercially available polarizing film or the like may be used as the polarizing filter.

In the organic EL device according to the present invention, the optical element is preferably the diffraction grating. It is possible to obtain an organic EL device having higher luminous efficiency by using a substrate with the diffraction grating and by adjusting the diffraction pitch of the diffraction grating of the substrate in a degree identical to that of visible light.

Further, in the organic EL device of the present invention, it is preferable to dispose an intermediate layer on the optical element within a thickness of 50 nm from the optical element. Thus, it is possible to stably form the electrodes over the intermediate layer as well as to stably fabricate an organic EL device with a good luminescence state by shortening a distance between the optical element and the organic EL layer, the organic EL layer being formed in a such way that an organic layer is interposed between the pair of electrodes.

In the present invention, if the refractive index of a material forming the intermediate layer is smaller than that of the electrode material formed on the intermediate layer, the film thickness of the intermediate layer preferably is in a range between 10 nm and 200 nm. In the case where the refractive index of the material forming the intermediate layer is smaller than that of the electrode material formed on the intermediate layer, there is a problem that it is difficult to form a flat electrode on the intermediate layer and also the lifetime of the device is significantly shortened at the film thickness of the intermediate layer less than 10 nm. Further, if the refractive index of the intermediate layer is smaller than that of the electrode material, there is a problem that the luminous efficiency is significantly degraded because the total reflection in the intermediate layer cannot be suppressed at the film thickness of the intermediate layer exceeding 200 nm.

On the other hand, if the refractive index of the material forming the intermediate layer is equal to or larger than that of the electrode material formed on the intermediate layer, the film thickness of the intermediate layer is preferably 300 nm or less. If the film thickness of the intermediate layer exceeds 300 nm in spite of this condition, there is a problem that the transmittance of the substrate including the intermediate layer is greatly degraded, which causes the luminous efficiency of the device to be significantly degraded.

In the organic EL device of the present invention, the material forming the intermediate layer may be equal to a material constituting the optical element, and be different from a material constituting the optical element. However, it is preferably that the transmittance of the material forming the intermediate layer is 70% or more. In other words, any materials may be adopted as the material for the intermediate layer as long as they have the transmittance meeting the above defined transmittance condition regardless of the material of the substrate. Further, this transmittance is a transmittance at a wavelength of 630 nm in quartz glass with the material of the intermediate layer formed in a thickness of 200 nm. The intermediate layer material can be formed by a sputtering method, a vacuum deposition method, a spin coating method, a CVD method, or the like. Further, a commercially available spectrophotometer (Shimazu UV4000, etc.) may be used to measure the transmittance.

In the present invention, the material forming the intermediate layer, preferably, is any one of silicon oxide ($SiO_2$), titanium oxide ($TiO_2$), indium tin oxide (ITO), indium zinc oxide (IZO), zinc oxide ($ZnO_2$), zirconium dioxide ($ZrO_2$), tantalum pentoxide ($Ta_2O_5$), alumina ($Al_2O_3$), and thin film diamond. The materials listed herein have the high transmittance as well as can form a stably homogeneous film on the substrate. Accordingly, it becomes possible to easily fabricate an organic EL device by using the above-stated material as the intermediate layer material.

In the present invention, it is preferable to use a spin coating method as a process of forming the intermediate layer. It is possible to easily form a highly flattened and homogeneous thin film by forming the intermediate layer using the spin coating method presented herein. By using the homogeneous intermediate layer, the reliability of the lifetime or the like of the organic EL device is improved and fabrication is easier, and mass production is possible. Further, the spin coating method in the present invention is a method in which so-called sol-gel coating liquid with the intermediate layer material dispersed in solvent is spin-coated on the substrate and then a hard film is formed by a baking process. However, any methods may be used only if they are film-forming methods using coating liquid and the present invention is not especially limited to them. Further, a representative example of this spin coating method may include a spin-on-glass method (SOG method) using a sol-gel glass as a coating material.

In the organic EL device of the present invention, it is preferable to carry out a planarization process on the substrate surface over which the intermediate layer is adhered. That is, a surface planarization process is carried out to adhere the intermediate layer, which makes it possible to form an intermediate layer having no deviation in a film thickness and a film quality within the substrate surface, and in turn to stack an organic EL layer with a good characteristic on the intermediate layer.

Further, in the organic EL device of the present invention, the planarization process to the substrate surface over which the intermediate layer is adhered is preferably either a polishing process or a reactive ion etching (hereinafter, referred to as RIE) process. By using the polishing process or the RIE process for the planarization process, it is possible to suppress the deviation of planarization within the substrate surface or deviation of the film thickness, and it is possible to easily fabricate an organic EL device with a uniform luminescence property over an entire surface of a large-sized substrate. Further, a chemical mechanical polishing (CMP) method or the like normally used in the semiconductor fabricating process may be used as the polishing process herein. This CMP method is a polishing manner in which mechanical polishing and chemical etching are carried out simultaneously, wherein polishing slurry in which particles such as silica or the like are suspended in alkali solution is used. And, in this polishing process, the polishing can be realized by promoting slidable connection between a polishing platen to which a polishing pad is attached and a substrate in a polishing slurry dropping condition. Particles are in charge of the mechanical polishing and alkali liquid is in charge of the etching process. Further, a commercially available apparatus may be used as the polisher. There is a NF3000 (produced by NANOFACTOR) as a representative apparatus. Further, as the polishing pad, a commercially available polishing pad may be used, and examples of the polishing pad include IC1000, Suba400 and the like but the pad is not especially limited to them. In addition, for the polishing slurry, silica powder or diamond powder may be used as a particle component, and solution or the like suspended in chemical material solution such as alkali metal system, ammonia system, amine system and the like may be used. Meanwhile, the RIE process (reactive ion etching process) is an etching method using a fron gas containing halogen compound, or the like, which makes it possible to reproduce a several ten times a higher etching rate as compared to, a typical sputter etching using argon gas. It is considered because ions produced in plasma and exciting active species coexist and they act on a sample, allowing physical and chemical etch to be performed. In the present invention, a RIE apparatus used in a typical production line may be utilized, and an optimal material gas may be used depending on the type of a material to be etched, namely, a material forming the intermediate layer. Representative examples of the material gas may include a halogen containing atomic gas such as $CF_4$, $CHF_3$ and the like, but the material gas is not especially limited to them.

In the organic EL device of the present invention, it is preferable that the optical element is formed from two types of materials having a different refractive index, wherein the difference between the refractive indexes of the two types of materials is 0.3 or more. By using the difference between the refractive indexes of materials constituting the optical element, it is possible to fabricate an optical element by combination of a material with a low refractive index and a material with a high refractive index and to significantly improve optical characteristic efficiency. For example, for the diffraction grating, the diffraction efficiency is. expected to be highly improved by enlarging the difference between the refractive indexes of two types of materials. Thus, improving the optical characteristic efficiency of the optical element enables the luminous efficiency of the organic EL device to be notably enhanced.

Subsequently, the organic EL layer of the organic EL device according to the present invention will be discussed. The structure of the organic EL device of the present invention is a structure in which one organic layer or two or more organic layers are stacked between an anode and a cathode. The basic structure of the device includes a structure in which an anode, an emission layer, and a cathode are stacked in this order, a structure in which an anode, a hole transporting layer, an emitting layer, an electron transporting layer, and a cathode are stacked in this order, a structure in which an anode, a hole transporting layer, an emitting layer, and a cathode are stacked in this order, a structure in which an anode, an emitting layer, an electron transporting layer, and a cathode are stacked in this order, or the like.

First, a hole transporting agent according to the present invention may be any material used as a typical hole transporting material. Representative examples of the agent may include a triphenyldiamine class such as bis(di(P-trile)aminophenyl)-1,1-cyclohexane(1), N-N'-diphenyl-N-N'-bis(3-methylphenyl)-1-1'-biphenyl-4-4'-diamine(2), and N-N'-diphenyl-N-N-bis(1-naphthyl-1,1'-biphenyl)-4,4'-diamine (3), starburst molecules ((04)~(06)), and the like, but the agent is not especially limited to them.

A charge transporting material according to the present invention may be any material only if it is a typically used charge transporting material. Representative examples of the charge transporting material may include an oxadiazole derivative ((09), (10)) such as 2-(4-biphenyl)-5-(4-t-butylphenyl)-1,3,4-oxadiazole (07), and bis{2-84-t-butylphenyl}-1,3,4-oxadiazole}-m-phenylene (08), a triazole derivative, a quinolinol metal complex ((11)~(14)), and the like, but the charge transporting material is not especially limited to them.

An organic EL material used in the organic EL device of the present invention may be any material only if it is a normally used light-emitting material. Representative examples of the organic EL material include a distirylaryllene derivative, a coumarin derivative, a dicyanomethyllenepyran derivative, a perillene derivative, an aromatic material disclosed in Japanese Patent Laid-open Nos. Hei 8-298186 and Hei 9-268284, an anthracene material disclosed in Japanese Patent Laid-open Nos. Hei 9-157643 and Hei 9-268283, a quinacridone derivative disclosed in Japanese Patent Laid-open No. Hei 5-70773, and the like, but the organic EL material is not especially limited to them.

The anode used in the organic EL device of the present invention has a function of injecting holes into a hole transporting material or a light-emitting material and preferably has a work function of 4.5 eV or more. There is a problem in that, if an anode with a work function less than 4.5 eV is used in the organic EL device, a sufficient hole injection characteristic cannot be obtained and sufficient luminous efficiency cannot be obtained. Further, representative anode materials include an indium tin oxide alloy (ITO), an indium zinc oxide alloy (IZO), oxide, gold, silver, platinum, copper, and the like but the anode material is not especially limited to them.

The cathode used in the organic EL device of the present invention aims at injecting electrons into the charge carrier body or the light-emitting material. It is preferable to use a material with a small work function for the cathode. Using a material with a large work function for the cathode makes it to difficult to obtain a good luminescence property. Further, representative cathode materials may include indium, aluminum, magnesium, magnesium-indium alloy, magnesium-aluminum alloy, aluminum-lithium alloy, aluminum-scandium-lithium alloy, magnesium-silver alloy, and the like, but the cathode material is not especially limited to them.

The respective layers of the organic EL device of the present invention may be formed by known methods. Representative methods may include a vacuum deposition method, a molecular beam epitaxy method (MBE method), a deeping method which is a method of melting a layer-forming material in solvent and carrying out coating using the solution, a spin coating method, a casting method, a bar coating method, a roll coating method, and the like, but the method is not especially limited to them.

EMBODIMENTS

Hereinafter, embodiments of the present invention will be described in detail, but the present invention is not, limited to the following embodiments as long as other embodiments do not depart from the its subject matter.

Embodiment 1

Figure 2:
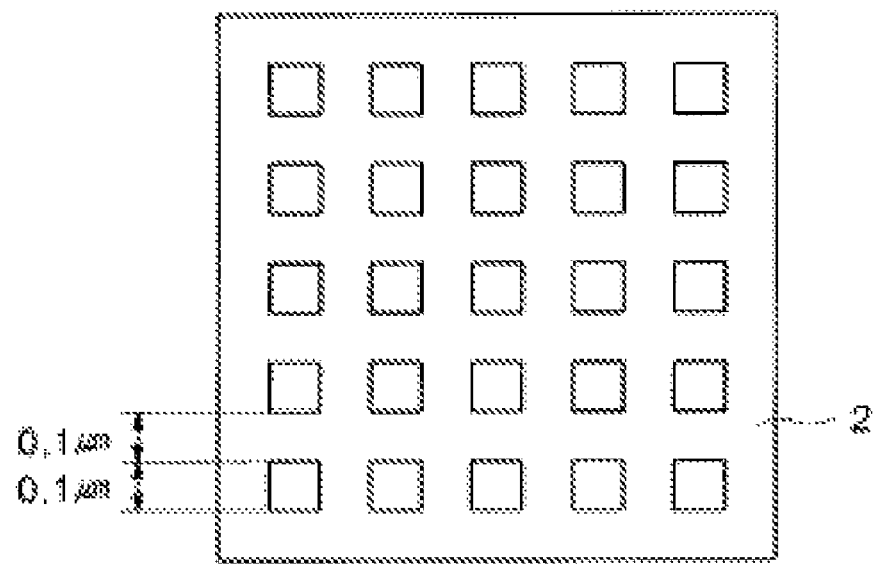
FIG. 2 is a cross-sectional view of a diffraction grating.

The structure of Embodiment 1 is shown in FIG. 1. A diffraction grating 2 shown in FIG. 2 was made on a glass substrate of 50 mm×50 mm (NA45 by HOYA, 1.1 mm thick). First, an i-ray resist (THMR-iP1700 by TOKYO OHKA KOGYO CO.) was formed in a thickness of 2 μm on the glass substrate 1 by a spin coating method, and a pattern was formed with a width of 0.1 μm and a space of 0.1 μm using an i-ray stepper. Subsequently, the substrate 1 having the pattern formed therein was immersed in hydrofluoric acid solution and a groove having a depth of 100 nm was formed, and thereafter the remaining resist was eliminated by a dedicated stripper liquid to thus obtain a diffraction grating 2. Subsequently, a $Si_3N_4$ film 7 was formed with a thickness of 300 nm by a sputtering method using silicon nitride ($Si_3N_4$) as a target. Further, a silicon oxide (SiO2) layer as an intermediate layer 3 was formed in a thickness of 50 nm on the $Si_3N_4$ film 7 by the sputtering method, and then an anode 4, an organic EL layer 5, and a cathode 6 was stacked in this order on the intermediate layer 3 to make the organic EL device.

Figure 3:
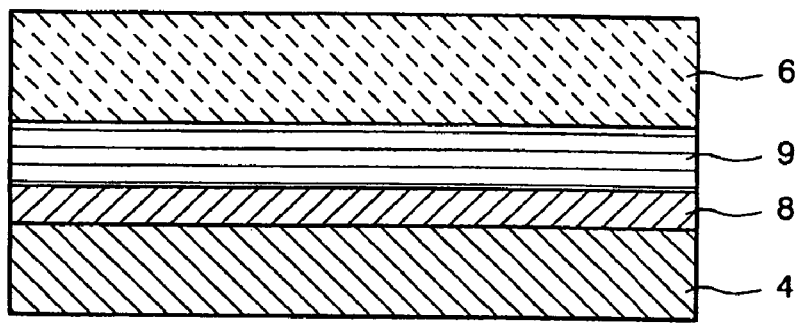
FIG. 3 is a schematic view of an organic electroluminescent layer according to the present invention.
Figure 4:
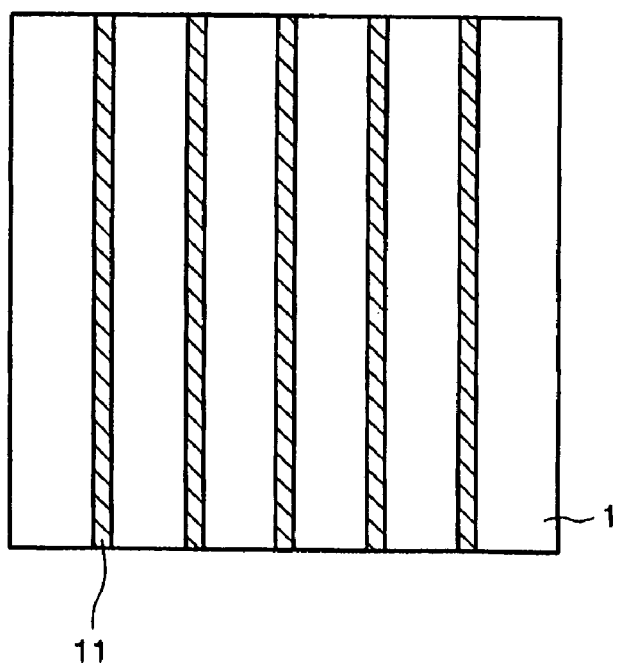
FIG. 4 is a schematic view of an ITO pattern used in an organic electroluminescent device of the present invention.

Further, a method for forming the organic EL layer 5 (a layer in which an anode 4, a hole injecting layer 8, an emitting layer 9, and a cathode 6 have been stacked in this order, as shown in FIG. 3) is as follows. An indium tin oxide alloy (ITO) was formed as the anode 4 on the substrate 1 by a sputtering method. The film thickness of the ITO presented herein was 100 nm and the sheet resistance was 20Ω/□. And, the formed ITO was patterned using a metal mask to be a stripe of 2 mm×50 mm. Further, five stripes of 2 mm×50 mm were made on the substrate 1 as shown in an ITO pattern portion 11 of FIG. 4.

Figure 5:
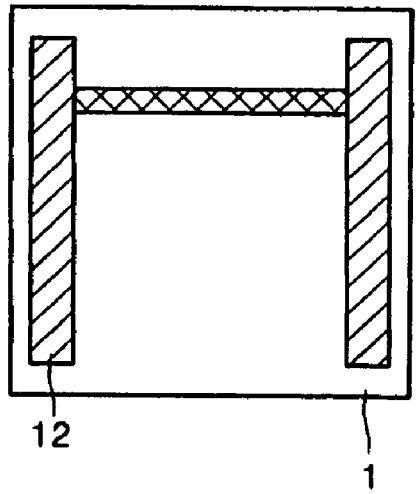
FIG. 5 is a schematic view of an anode forming mask in an organic electroluminescent device of the present invention.
Figure 6:
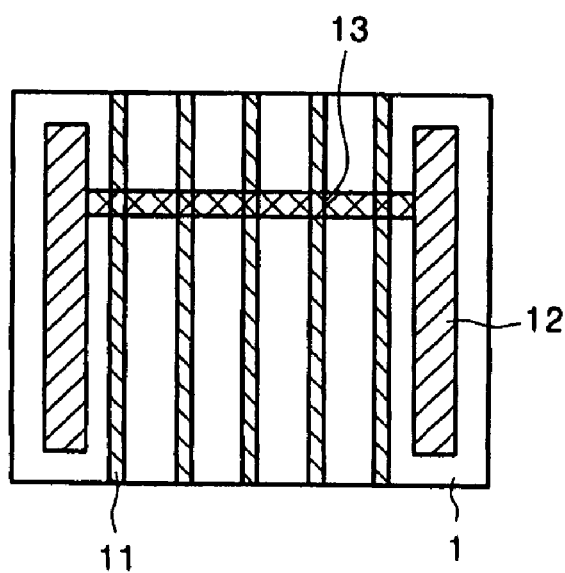
FIG. 6 is a schematic view of an emitting portion in an organic electroluminescent device of the present invention.

Subsequently, the hole injecting layer 8, the emitting layer 9, and the cathode 6 were formed in this order on the ITO layer, as the anode 4, by a resistance-heated vacuum deposition method. A vacuum deposition apparatus (not shown) used to form this organic EL layer 5 comprises a molybdenum boat filled with an evaporating material, the boat being positioned at a distance of 250 mm below the substrate, placed at a upper portion of a vacuum chamber, and at an incident angle to the substrate of 38°. The substrate was rotated at 30 revolutions per minute. Further, in this embodiment, for a film-forming (deposition) condition, the deposition was initiated at a point of time when pressure reaches $5 \times 10^{-7}$ Torr, and a deposition rate was controlled by a crystal oscillator type film thickness control device longitudinally mounted on the substrate. Further, the deposition rate was set to 0.15 nm/s. N,N'-diphenyl-N-N-bis(1-naphthyl)-1,1'-biphenyl)-4,4'-diamine (hereinafter, referred to as α-NMP) of 50 nm as the hole injecting layer, tris(8-quinolinol)aluminum (hereinafter, referred to as ALQ) of 70 nm as the light-emitting material, and magnesium-silver alloy of 150 nm as the cathode were sequentially formed at a deposition rate ratio of 10:1 by co-deposition, to fabricate an organic EL device. Further, a pattern (cathode pattern 12) shown in FIG. 5 was formed using a metal mask. As a result, in the organic EL device of this embodiment, five organic EL portions 13 each having a size of 2 mm×2 mm were formed on the substrate 1 in the pattern shape of the cathode 4 and the anode 6, as shown in FIG. 6.

Embodiment 2

Embodiment 2 is the same as Embodiment 1 except that, in the structure and fabricating process, only the pitch of the diffraction grating 2 was changed to a width of 0.05 µm, a space of 0.05 µm, and a depth of 100 nm.

Embodiment 3

Embodiment 3 is the same as Embodiment 1 except that, in the structure and fabricating process, a glass substrate (NA45 by HOYA, 1.1 mm thick) of 50 mm×50 mm was immersed in standard hydrofluoric acid liquid and the substrate surface was made to be coarse to form a scattering portion.

Subsequently, this scattering portion was buried, the intermediate layer 3 was formed, and the organic EL layer 5 was formed in the same condition as in Embodiment 1 to fabricate the organic EL device.

Embodiment 4

Embodiment 4 is the same as Embodiment 1 except that, in the structure and fabricating process, the surface of a glass substrate (NA45 by HOYA, 1.1 mm thick) of 50 mm×50 mm was rubbed with sandpaper #300, making the substrate surface to be coarse. As a result, a scattering portion was obtained.

Subsequently, this scattering portion was buried, the intermediate layer 3 was formed, and the organic EL layer 5 was formed in the same condition as in Embodiment 1 to fabricate the organic EL device.

Embodiment 5

Figure 7:
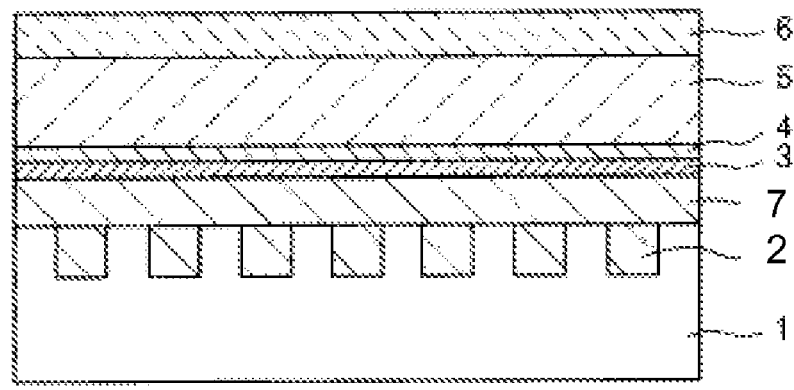
FIG. 7 is a structure view of Embodiment 5.

The structure of the organic EL device of Embodiment 5 is shown in FIG. 7.

A diffraction grating 2 was made in the same condition as in Embodiment 1 and was buried. The $Si_3N_4$ film 7 was subject to a planarization process. This planarization process was made by a mechanical polishing method. The $Si_3N_4$ film 7 was cut out to have the residue of the film within 10 nm from the diffraction grating 2 of the $Si_3N_4$ film 7. Thereafter, a $SiO_2$ film as the intermediate layer 3 was formed on the $Si_3N_4$ film 7 to be a thickness of 50 nm in the same condition as in Embodiment 1, and the anode 4, the organic layer 5, and the cathode 6 were formed in this order on the $SiO_2$ film, as shown in FIG. 7 to fabricate the organic EL device. The organic layer 5 is a layer obtained by stacking the hole injecting layer 8, the emitting layer 9, and the cathode 6 in this order on the anode 4.

Embodiment 6

Embodiment 6 is the same as Embodiment 5 except that, in the structure and fabricating process, the film thickness of the $SiO_2$ film as the intermediate layer 3 was changed to 20 nm.

Embodiment 7

Embodiment 7 is the same as Embodiment 5 except that, in the structure and fabricating process, the film thickness of the $SiO_2$ film as the intermediate layer 3 was changed to 200 nm.

Embodiment 8

Embodiment 8 is the same as Embodiment 5 except that, in the structure and fabricating process, a silicon nitride ($Si_3N_4$) film is used for the material of the intermediate layer 3. Further, the film thickness of the $Si_3N_4$ film was changed to 50 nm.

Embodiment 9

Embodiment 9 is the same as Embodiment 8 except that, in the structure and fabricating process, the film thickness of the $Si_3N_4$ film as the intermediate layer 3 was changed to 100 nm.

Embodiment 10

Embodiment 10 is the same as Embodiment 8 except that, in the structure and fabricating process, the film thickness of the $Si_3N_4$ film as the intermediate layer 3 was changed to 300 nm.

Embodiment 11

Embodiment 11 is the same as Embodiment 5 except that, in the structure and fabricating process, a titanium oxide ($TiO_2$) film was used for the material of the intermediate layer 3. Further, the film thickness of the $TiO_2$ film was 50 nm.

Embodiment 12

Embodiment 12 is the same as Embodiment 5 except that, in the structure and fabricating process, a zirconium dioxide ($ZrO_2$) film was used for the material of the intermediate layer 3. Further, the film thickness of the $ZrO_2$ film was 50 nm.

Embodiment 13

Embodiment 13 is the same as Embodiment 5 except that, in the structure and fabricating process, a tantalum pentoxide ($Ta_2O_5$) film was used for the material of the intermediate layer 3. Further, the film thickness of the $Ta_2O_5$ film was 5 nm.

Embodiment 14

Embodiment 14 is the same as Embodiment 5 except that, in the structure and fabricating process, an indium tin oxide (ITO) film was used for the material of the intermediate layer 3. Further, the film thickness of the ITO film was 50 nm.

Embodiment 15

Embodiment 15 is the same as Embodiment 5 except that, in the structure and fabricating process, only the method of forming the intermediate layer was changed. The intermediate layer ($SiO_2$) was formed by the spin coating method using sol-gel coating liquid (Si-05S by High Pure Chemical Research Institute) used to form the $SiO_2$ film. Further, the spin coating was carried out at the revolutions of 2000 to 5000 rpm, and the baking of the sol-gel coating liquid was carried out at 500° C. for 4 hours. In addition, the thickness of the $SiO_2$ film was 50 nm.

Embodiment 16

Embodiment 16 is the same as Embodiment 11 except that, in the structure and fabricating process, only the method of forming the intermediate layer 3 was changed. The intermediate layer (TiO$_2$) was formed by the spin coating method using organic metal decomposing method coating liquid (Ti-05S by High Pure Chemical Research Institute) used to form the TiO$_2$ film. Further, the spin coating was carried out at a revolution of 2000 to 5000 rpm, and the baking of the sol-gel coating liquid was carried out at 400° C. for 2 hours. In addition, the film thickness of the TiO$_2$ was 50 nm.

Embodiment 17

Embodiment 17 is the same as Embodiment 12 except that, in the structure and fabricating process, only the method of forming the intermediate layer was changed. The intermediate layer (ZrO$_2$) was formed by a spin coating method using organic metal decomposing method coating liquid (Zr-05-P by High Pure Chemical Research Institute) used to form a ZrO$_2$ film. Further, the spin coating was carried out at revolutions of 2000 to 5000 rpm, and baking the coating liquid was carried out at 400° C. for 2 hour. In addition, the thickness of the ZrO$_2$ film was 50 nm.

Embodiment 18

Embodiment 18 is the same as Embodiment 5 except that, in the structure and fabricating process, only the planarization process for the intermediate layer 3 was changed, in which a CMP (Chemical Mechanical Polishing) process was used to flatten a groove processing film (Si$_3$N$_4$). In this CMP process, Suba400 was used for the polishing pad, and colloidal silica polishing liquid having a particle diameter of 200 nm was used for the polishing slurry. Further, a commercially available CMP apparatus was used for the polisher.

Embodiment 19

Embodiment 19 is the same as Embodiment 5 except that, in the structure and fabricating process, only the planarization process for the intermediate layer 3 was changed to a reactive ion etching process (hereinafter, referred to as RIE process). This RIE process was carried out with a tetrafluoromethane (CF$_4$) gas for the material gas, using a commercially available RIE apparatus.

Embodiment 20

Embodiment 20 is the same as Embodiment 5 except that, in the structure and fabricating process, only the material for the groove processing film for the diffraction grating 2 was changed, an indium tin oxide (ITO) film being used as the groove processing film. Further, the ITO film was formed by the sputtering method with the film thickness being 200 nm and the refractive index being 1.83.

Embodiment 21

Embodiment 21 is the same as Embodiment 5 except that, in the structure and fabricating process, only the material of the groove processing film for the diffraction grating was changed, a titanium oxide (TiO$_2$) film being used as the burying film. Further, the TiO$_2$ film was formed by the sputtering method with the film thickness being 200 nm and the refractive index being 2.1.

Embodiment 22

Embodiment 22 is the same as Embodiment 5 except that, in the structure and fabricating process, only the material of the groove processing film for the diffraction grating was changed, a zirconium dioxide (ZrO$_2$) film being used as the burying film. Further, the ZrO$_2$ film was formed by the sputtering method with the film thickness being 200 nm and the refractive index being 2.04.

COMPARATIVE EXAMPLE 1

Figure 8:
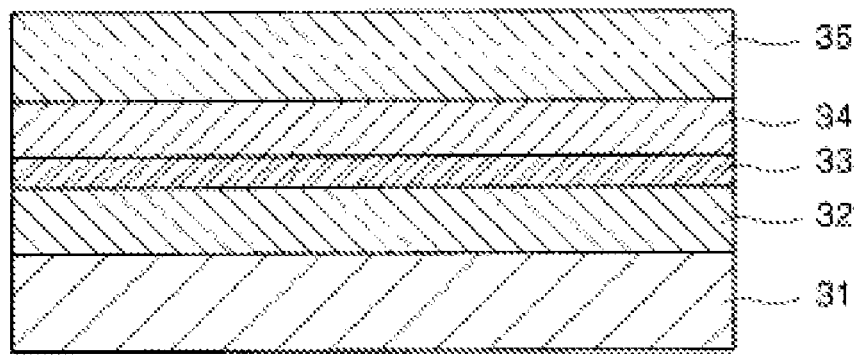
FIG. 8 is a structure view of Comparative example 1.

A sequence of fabricating an organic thin film electroluminescent device used in Comparative example 1 is shown. FIG. 8 is a structure view of Comparative example 1.

In FIG. 8, the device was configured by stacking a glass substrate 31, an anode (ITO) 32, a hole injecting layer (α-NMP) 33, an emitting layer (AlQ) 34, and a cathode (MgAg) 35 in this order.

An indium tin oxide alloy (ITO) was formed on the glass substrate 31 of 50 mm×25 mm (NA45 produced by HOYA, 1.1 mm thick) by a sputtering method, and was used as the anode 32. The film thickness of the ITO was 100 nm, and sheet resistance was 20Ω/□. And, the formed ITO was patterned using a metal mask to be a stripe of 2 mm×50 mm.

Subsequently, the hole injecting layer 33, the emitting layer 34 and the cathode 35 were each stacked in this order on the ITO layer of the anode 32. Further, the organic layers (the hole injecting layer 33 and the emitting layer 34) and the cathode 35 were formed using a resistance-heating vacuum deposition method.

A film-forming sequence by a vacuum deposition method will be hereinafter explained in detail. In the vacuum deposition apparatus used, with respect to a substrate disposed at an upper portion of a vacuum chamber, a molybdenum boat filled with a deposition material was disposed at a distance of 250 nm downwardly from this substrate and was positioned to have an incident angle to the substrate of 38°. The substrate was rotated at 30 revolutions per minute. In case of film-forming (deposition) in Comparative example 1, the deposition was initiated at a time point when pressure reaches $5\times10^{-7}$ Torr and a deposition rate was controlled by a crystal oscillator type film thickness control device mounted longitudinally on the substrate. Further, the organic EL device was fabricated at a deposition rate of 0.15 nm/s, sequentially stacking N,N'-diphenyl-N-N-bis(1-naphthyl)-1,1'-biphenyl)-4,4'-diamine (hereinafter, referred to as α-NMP) of 50 nm as the hole injecting layer, tris(8-quinolinol)aluminum (hereinafter, referred to as ALQ) of 70 nm as the light-emitting material, and a magnesium-silver alloy of 150 nm as the cathode at a deposition rate ratio 10:1 by co-deposition.

COMPARATIVE EXAMPLE 2

An organic EL device was fabricated by sequentially stacking an anode, a hole injecting layer, an emitting layer, and a cathode on a quartz glass (1.1 mm thick). Further, processes following the anode formation process were carried out in the same condition as Comparative example 1.

COMPARATIVE EXAMPLE 3

Comparative example 3 is the same as Embodiment 1 except that only the intermediate layer was eliminated from the structure and fabricating process.

COMPARATIVE EXAMPLE 4

Comparative example 4 is the same as Embodiment 2 except that only the intermediate layer was eliminated from the structure and fabricating process.

COMPARATIVE EXAMPLE 5

Comparative example 5 is the same as Embodiment 3 except that only the intermediate layer was excluded from the structure and fabricating process.

COMPARATIVE EXAMPLE 6

Comparative example 6 is the same as Embodiment 4 except that only the intermediate layer was eliminated from the structure and fabricating process.

COMPARATIVE EXAMPLE 7

Comparative example 7 is the same as Embodiment 5 except that only the intermediate layer was eliminated from the structure and fabricating process.

COMPARATIVE EXAMPLE 8

Comparative example 8 is the same as Embodiment 18 except that only the intermediate layer was eliminated from the structure and fabricating process.

COMPARATIVE EXAMPLE 9

Comparative example 9 is the same as Embodiment 19 except that only the intermediate layer was eliminated from the structure and fabricating process.

COMPARATIVE EXAMPLE 10

Comparative example 10 is the same as Embodiment 20 except that only the intermediate layer was eliminated from the structure and fabricating process.

COMPARATIVE EXAMPLE 11

Comparative example 11 is the same as Embodiment 21 except that only the intermediate layer was eliminated from the structure and fabricating process.

COMPARATIVE EXAMPLE 12

Comparative example 12 is the same as Embodiment 22 except that only the intermediate layer was eliminated from the structure and fabricating process.

(Evaluation)

Figure 9:
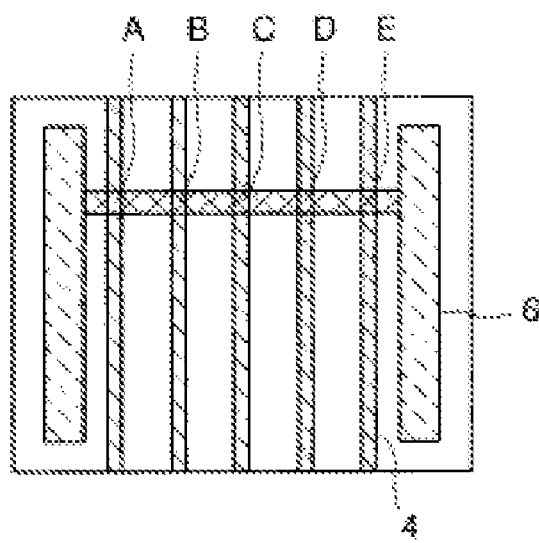
FIG. 9 is a schematic view showing positions of an emitting portion used for evaluation.

The organic EL devices of Embodiments 1 to 22 and Comparative examples 1 to 12 were subject to the characteristic evaluation of Evaluations 1 to 6. Further, the substrate of the embodiments and the comparative examples has five emission portions having a size of 2 mm×2 mm (at positions A, B, C, D, and E) on the substrate 1, as shown in FIG. 9.

[Evaluation 1] Luminous Efficiency

Current density ($mA/cm^2$) and brightness (cd) were measured after applying a voltage of 10V to the organic EL device, and luminous efficiency ($cd/m^2$) was calculated from the brightness and the current density. Further, the measurement was made at a center portion of the substrate as a measuring position, and with a photometer. Further, the evaluation of this luminous efficiency was carried out on four emitting portions (positions A, B, C, D and E) on the substrate.

[Evaluation 2] Luminescence Property

The luminescence state of the emission portion was observed after applying a voltage of 10V to the organic EL device. This observation was carried out by eyes and the luminescence property was determined by the following index. Further, this evaluation was carried out four emitting portions (positions A, B, C and D) on each substrate.

○: all the emitting portions exhibit good luminescence over entire surfaces.

□: non-luminescence is locally observed.

x: an emitting portion that does not emit light is observed.

[Evaluation 3] Lifetime Evaluation

The lifetime was measured after a direct current of 5 $mA/cm^2$ has been applied to the organic EL device for 100 hours. In this evaluation, a change rate (Ea/Eb) between the luminous efficiency (Ea) when 100 hours has elapsed after the current application and the luminous efficiency (Eb) within 2 minutes after the current application was calculated and lifetime performance was determined by the following index. Further, this lifetime was measured at the emitting portion E.

○: La/Lb is more than 0.90

□: La/Lb is more than 0.80 and less than 0.90 x: La/Lb is less than 0.80

[Evaluation 4] Evaluation of characteristic deviation in the substrate

The deviation of the luminous efficiency on the substrate surface in each of the embodiments and the comparative examples was evaluated. For this evaluation, the luminous efficiency was measured at four emitting portions (positions A, B, C and D) on each substrate, and the deviation was determined using the following determination index, where a maximum value in the four emitting portions is Emax and a minimum value is Emin. Further, the evaluation of the luminous efficiency was made by measuring the luminous efficiency upon applying a voltage of 10V as in Evaluation 1.

○: Emin/Emax is more than 0.90

□: Emin/Emax is more than 0.80 and less than 0.90 x: Emin/Emax is less than 0.80

[Evaluation 5] Production Stability 1 (confirming reproductivity of good luminescence)

Three substrates as illustrated in the embodiments and three substrates as illustrated in the comparative examples were made in the same fabrication condition, and production stability.(confirmation of good luminescence reproducibility) was evaluated. This evaluation was made by observing the luminescence state of the devices on the three substrates fabricated to confirm the production reproductivity by eyes, and by using the following indexes. Further, for this evaluation, four emitting portions (positions A, B, C and D) on each of the three substrates was observed, and at totally twelve emitting portions.

○: all emission portions exhibit good luminescence over entire surfaces.

□: non-luminescence is locally observed.

x: an emitting portion that does not emit light is observed.

[Evaluation 6] Production Stability 2 (confirming the reproductivity of luminous efficiency)

Three substrates as illustrated in the embodiments and three substrates as illustrated in the comparative examples were fabricated in the same fabrication condition to evaluate the production stability (confirming the reproductivity of luminous efficiency). This evaluation is production stability evaluation, and efficiency is measured at four emitting portions (position A, B, C and D) on the three fabricated substrates (a total of twelve, four emission portions×three substrates). The determination of the reproductivity carried out using the following indexes in which a value indicating a maximum value among the values measured at 12 emitting portions is Emax and a value indicating a minimum value Emin. Further, the evaluation of luminous efficiency was made by measuring the luminous efficiency upon applying the voltage of 10V as in the evaluation 1.
- ○: Emin/Emax is more than 0.90
- □: Emin/Emax is more than 0.80 and less than 0.90
- x: Emin/Emax is less than 0.80.

[Evaluation 7] Production Stability 3 (confirming the reproductivity of device's lifetime)

Three substrates as illustrated in the embodiments and three substrates as illustrated in the comparative examples were fabricated in the same fabrication condition to evaluate the production stability (confirming the reproductivity of device's lifetime). This lifetime evaluation is to apply a direct current of 5 mA/cm$^2$ to the organic EL device for 100 hours and at this time measure the luminous efficiency. The evaluation was made at the emission portion E on each substrate. Further, the lifetime reproducibility was determined by the following indexes where a maximum value in the evaluated values of three substrates of each of the embodiments and the comparative examples is Emax and a minimum value is Emin.

- ○: Lmin/Lmax is more than 0.90
- □: Lmin/Lmax is more than 0.80 and less than 0.90
- x: Lmin/Lmax is less than 0.80

TABLE 1

Evaluation 1

|  | Position A | Position B | Position C | Position D |
|---|---|---|---|---|
| Embodiment 1 | 5.56 | 5.43 | 5.30 | 6.29 |
| Embodiment 2 | 5.69 | 5.99 | 5.46 | 5.68 |
| Embodiment 3 | 5.09 | 5.18 | 4.89 | 5.00 |
| Embodiment 4 | 4.23 | 4.41 | 4.56 | 4.49 |
| Embodiment 5 | 4.71 | 4.68 | 4.62 | 4.73 |
| Embodiment 6 | 5.40 | 5.28 | 5.43 | 5.36 |
| Embodiment 7 | 5.50 | 6.71 | 5.56 | 5.66 |
| Embodiment 8 | 5.13 | 5.06 | 4.99 | 5.09 |
| Embodiment 9 | 5.69 | 5.68 | 6.47 | 5.59 |
| Embodiment 10 | 5.80 | 5.31 | 6.26 | 6.18 |
| Embodiment 11 | 5.11 | 6.16 | 4.99 | 4.98 |
| Embodiment 12 | 5.71 | 6.78 | 5.64 | 5.81 |
| Embodiment 13 | 6.10 | 6.07 | 6.08 | 5.87 |
| Embodiment 14 | 5.99 | 5.64 | 5.49 | 6.70 |
| Embodiment 15 | 5.69 | 5.26 | 5.43 | 5.42 |
| Embodiment 16 | 5.86 | 5.81 | 5.74 | 5.81 |
| Embodiment 17 | 6.18 | 6.18 | 6.17 | 5.98 |
| Embodiment 18 | 5.98 | 5.94 | 5.98 | 5.30 |
| Embodiment 19 | 5.71 | 6.70 | 6.79 | 5.65 |
| Embodiment 20 | 5.31 | 6.34 | 6.22 | 6.32 |
| Embodiment 21 | 5.64 | 5.76 | 5.81 | 6.66 |
| Embodiment 22 | 5.41 | 5.23 | 5.29 | 5.44 |
| Comparative example 1 | 3.92 | 3.87 | 4.09 | 3.81 |
| Comparative example 2 | 3.86 | 4.15 | 4.11 | 3.81 |
| Comparative example 3 | 6.83 | — | 4.93 | 5.29 |
| Comparative example 4 | — | 5.76 | 5.60 | — |
| Comparative example 5 | 5.26 | 6.03 | — | 6.69 |
| Comparative example 6 | 4.61 | 4.21 | 4.10 | 9.71 |
| Comparative example 7 | 4.81 | 4.43 | 4.62 | 4.81 |
| Comparative example 8 | 6.53 | — | 5.42 | 4.76 |
| Comparative example 9 | 6.93 | 6.23 | 3.57 | 8.19 |
| Comparative example 10 | — | 4.96 | — | 5.12 |
| Comparative example 11 | — | 5.01 | 5.79 | 5.19 |
| Comparative example 12 | 5.81 | — | 5.10 | — |

TABLE 2

Evaluation 2

|  | Position A | Position B | Position C | Position D |
|---|---|---|---|---|
| Embodiment 1 | ○ | ○ | ○ | ○ |
| Embodiment 2 | ○ | ○ | ○ | ○ |
| Embodiment 3 | ○ | ○ | ○ | ○ |

TABLE 2-continued

Evaluation 2

|  | Position A | Position B | Position C | Position D |
|---|---|---|---|---|
| Embodiment 4 | ○ | ○ | ○ | ○ |
| Embodiment 5 | ○ | ○ | ○ | ○ |
| Embodiment 6 | ○ | ○ | ○ | ○ |
| Embodiment 7 | ○ | ○ | ○ | ○ |
| Embodiment 8 | ○ | ○ | ○ | ○ |
| Embodiment 9 | ○ | ○ | ○ | ○ |
| Embodiment 10 | ○ | ○ | ○ | ○ |
| Embodiment 11 | ○ | ○ | ○ | ○ |
| Embodiment 12 | ○ | ○ | ○ | ○ |
| Embodiment 13 | ○ | ○ | ○ | ○ |
| Embodiment 14 | ○ | ○ | ○ | ○ |
| Embodiment 15 | ○ | ○ | ○ | ○ |
| Embodiment 16 | ○ | ○ | ○ | ○ |
| Embodiment 17 | ○ | ○ | ○ | ○ |
| Embodiment 18 | ○ | ○ | ○ | ○ |
| Embodiment 19 | ○ | ○ | ○ | ○ |
| Embodiment 20 | ○ | ○ | ○ | ○ |
| Embodiment 21 | ○ | ○ | ○ | ○ |
| Comparative example 1 | ○ | ○ | ○ | ○ |
| Comparative example 2 | ○ | ○ | ○ | ○ |
| Comparative example 3 | ○ | x | ○ | ○ |
| Comparative example 4 | x | ○ | ○ | x |
| Comparative example 5 | ○ | x | x | Δ |
| Comparative example 6 | ○ | Δ | Δ | Δ |
| Comparative example 7 | Δ | ○ | ○ | Δ |
| Comparative example 8 | ○ | ○ | x | Δ |
| Comparative example 9 | Δ | ○ | ○ | ○ |
| Comparative example 10 | x | Δ | x | Δ |
| Comparative example 11 | x | ○ | ○ | Δ |
| Comparative example 12 | ○ | x | Δ | x |

TABLE 3

Evaluation 3 to 5

|  | Evaluation 3 (La/Lb) | Evaluation 4 (Emin/Emax) | Evaluation 5 |
|---|---|---|---|
| Embodiment 1 | ○(0.984) | ○(0.951) | ○ |
| Embodiment 2 | ○(0.973) | ○(0.947) | ○ |
| Embodiment 3 | ○(0.952) | ○(0.928) | ○ |
| Embodiment 4 | ○(0.980) | ○(0.951) | ○ |
| Embodiment 5 | ○(0.976) | ○(0.976) | ○ |
| Embodiment 6 | ○(0.921) | ○(0.972) | ○ |
| Embodiment 7 | ○(0.949) | ○(0.971) | ○ |
| Embodiment 8 | ○(0.952) | ○(0.972) | ○ |
| Embodiment 9 | ○(0.961) | ○(0.976) | ○ |
| Embodiment 10 | ○(0.972) | ○(0.977) | ○ |
| Embodiment 11 | ○(0.948) | ○(0.965) | ○ |
| Embodiment 12 | ○(0.937) | ○(0.970) | ○ |
| Embodiment 13 | ○(0.982) | ○(0.962) | ○ |
| Embodiment 14 | ○(0.951) | ○(0.941) | ○ |
| Embodiment 15 | ○(0.957) | ○(0.961) | ○ |
| Embodiment 16 | ○(0.961) | ○(0.958) | ○ |
| Embodiment 17 | ○(0.924) | ○(0.961) | ○ |
| Embodiment 18 | ○(0.931) | ○(0.975) | ○ |
| Embodiment 19 | ○(0.921) | ○(0.976) | ○ |
| Embodiment 20 | ○(0.947) | ○(0.996) | ○ |
| Embodiment 21 | ○(0.952) | ○(0.967) | ○ |
| Embodiment 22 | ○(0.981) | ○(0.961) | ○ |
| Comparative example 1 | ○(0.966) | ○(0.945) | Δ |
| Comparative example 2 | ○(0.971) | ○(0.918) | ○ |
| Comparative example 3 | x(0.691) | x | x |
| Comparative example 4 | x(0.733) | x | x |
| Comparative example 5 | x(0.781) | x | x |
| Comparative example 6 | x(0.620) | Δ(0.904) | Δ |
| Comparative example 7 | x(0.711) | Δ(0.896) | Δ |
| Comparative example 8 | x(0.761) | x | x |
| Comparative example 9 | Δ(0.813) | Δ(0.894) | Δ |
| Comparative example 10 | x(0.761) | x | x |
| Comparative example 11 | x(0.743) | x | x |
| Comparative example 12 | x(0.761) | x | x |

TABLE 4

Evaluations 6 to 7

|  | Evaluation 6 (La/Lb) | Evaluation 7 (Emin/Emax) |
|---|---|---|
| Embodiment 1 | ○(0.931) | ○(0.931) |
| Embodiment 2 | ○(0.911) | ○(0.955) |
| Embodiment 3 | ○(0.920) | ○(0.948) |
| Embodiment 4 | ○(0.908) | ○(0.960) |
| Embodiment 5 | ○(0.965) | ○(0.925) |
| Embodiment 6 | ○(0.962) | ○(0.931) |
| Embodiment 7 | ○(0.954) | ○(0.948) |
| Embodiment 8 | ○(0.931) | ○(0.945) |
| Embodiment 9 | ○(0.951) | ○(0.942) |
| Embodiment 10 | ○(0.917) | ○(0.923) |
| Embodiment 11 | ○(0.926) | ○(0.912) |
| Embodiment 12 | ○(0.962) | ○(0.961) |
| Embodiment 13 | ○(0.941) | ○(0.957) |
| Embodiment 14 | ○(0.838) | ○(0.971) |
| Embodiment 15 | ○(0.907) | ○(0.926) |
| Embodiment 16 | ○(0.912) | ○(0.934) |
| Embodiment 17 | ○(0.961) | ○(0.928) |
| Embodiment 18 | ○(0.967) | ○(0.949) |
| Embodiment 19 | ○(0.941) | ○(0.982) |
| Embodiment 20 | ○(0.981) | ○(0.941) |
| Embodiment 21 | ○(0.923) | ○(0.928) |
| Embodiment 22 | ○(0.945) | ○(0.941) |
| Comparative example 1 | ○(0.901) | ○(0.928) |
| Comparative example 2 | Δ(0.887) | Δ(0.923) |
| Comparative example 3 | x | x(0.621) |
| Comparative example 4 | x | x(0.612) |
| Comparative example 5 | x | Δ(0.812) |
| Comparative example 6 | x(0.748) | x(0.423) |
| Comparative example 7 | x(0.782) | x(0.612) |
| Comparative example 8 | x | x(0.691) |
| Comparative example 9 | x(0.652) | Δ(0.923) |
| Comparative example 10 | x | x(0.532) |
| Comparative example 11 | x | x(0.511) |
| Comparative example 12 | x | x(0.423) |

As seen from the results of the embodiments and the comparative examples, the organic electroluminescent device of the present invention has a good luminescence property and high luminous efficiency.

Figure 10:
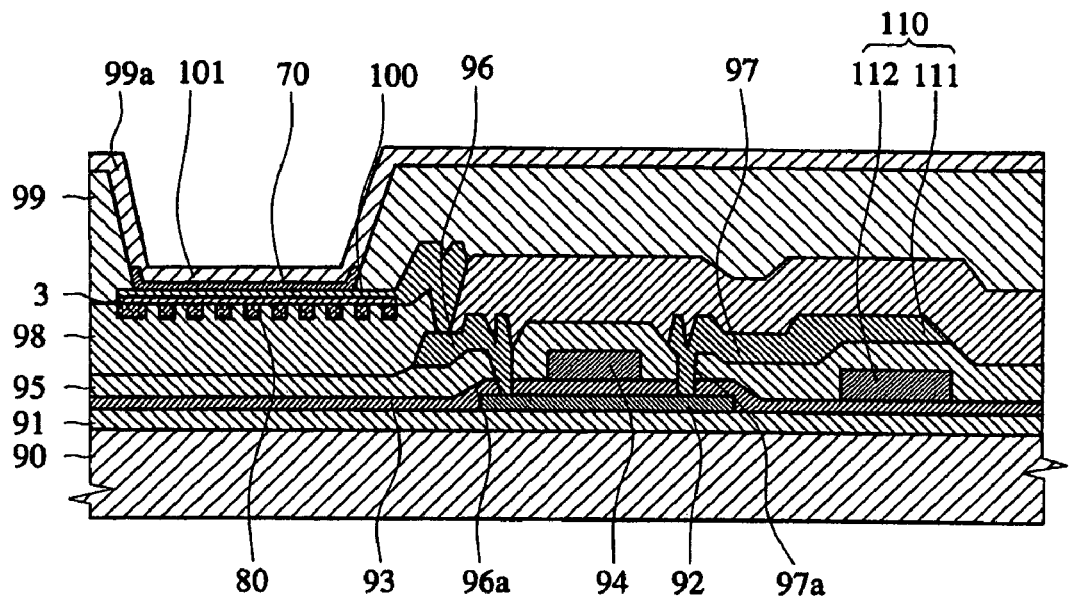
FIG. 10 illustrates an example of an active matrix organic light emitting display as an organic light emitting display that uses the organic light emitting element of FIG. 1.

Meanwhile, FIG. 10 Illustrates an example of an active matrix organic light emitting display as an organic light emitting display that uses the organic light emitting element of FIG. 1.

Referring to the figure, a buffer layer 91 is formed on a transparent substrate 90. The buffer layer 91 is greatly separated into a pixel region 200, which has each pixel and a semiconductor layer 92 for forming the pixel, and a driving region 300 where a thin film transistor and a capacitor are formed.

The driving region includes a gate electrode layer 94 and a first insulating film 95 burying the gate electrode layer 94, which correspond to an n or p type semiconductor layer 92 arranged in a given pattern on the buffer layer 91, present on a gate insulating layer 93 that buries the semiconductor layer 92; a thin film transistor having a drain electrode 96 and a source electrode 97 each connected to both sides of the semiconductor layer 92 via contact holes 96a and 97a formed in the first insulating film 95 and the gate insulating layer 93, and formed on a upper portion of the first insulating film 95; and a capacitor 110 composed of a first auxiliary electrode 111 connected to the source electrode 97 and formed on the first insulating layer 95, and a second auxiliary electrode 112 opposing to the first electrode and buried by the first insulting layer 95.

A second insulating layer 98 formed on the first insulting layer 95, and a planarization film 99 with an opening 99a formed in the pixel-forming region are formed. A first electrode layer 100 is formed at the bottom of the opening in the planarization film 99 and is electrically connected to the drain electrode 96.

The planarization film 99 has grooves 80 formed in the pixel-forming region. A diffraction grating is formed by the grooves 80.

At this time, an SiO2 film as the intermediate layer 3 is formed on the planarization having the grooves in the pixel-forming region.

An organic layer 70 is stacked on the first electrode layer 100. A second electrode layer 101 is formed on the organic layer and the planarization film 99.

Meanwhile, in the bottom emitting organic light emitting diode display comprising the first electrode layer 100 formed of ITO being a transparent conductive material and comprising the substrate 90, the buffer layer 91, the gate insulating layer 93, and the first and second insulating layers 95 and 98 each formed of a transparent material, as described above, the grooves 80 of a diffraction grating is formed in a given pattern on the second insulating layer 98 between the transparent electrode 100 and the second insulating layer 98. The grooves 80 has the same configuration as in the above-stated embodiment.

Figure 11:
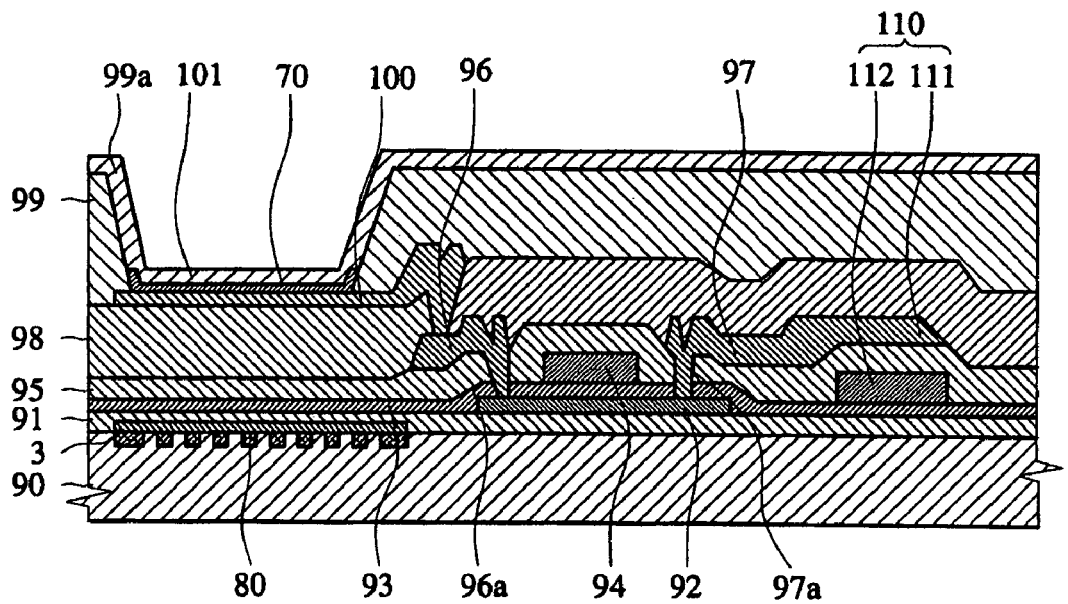
FIGS. 11 and 12 illustrates other examples of an active matrix organic light emitting display as an organic light emitting display that uses the organic light emitting element of FIG. 1.
Figure 12:
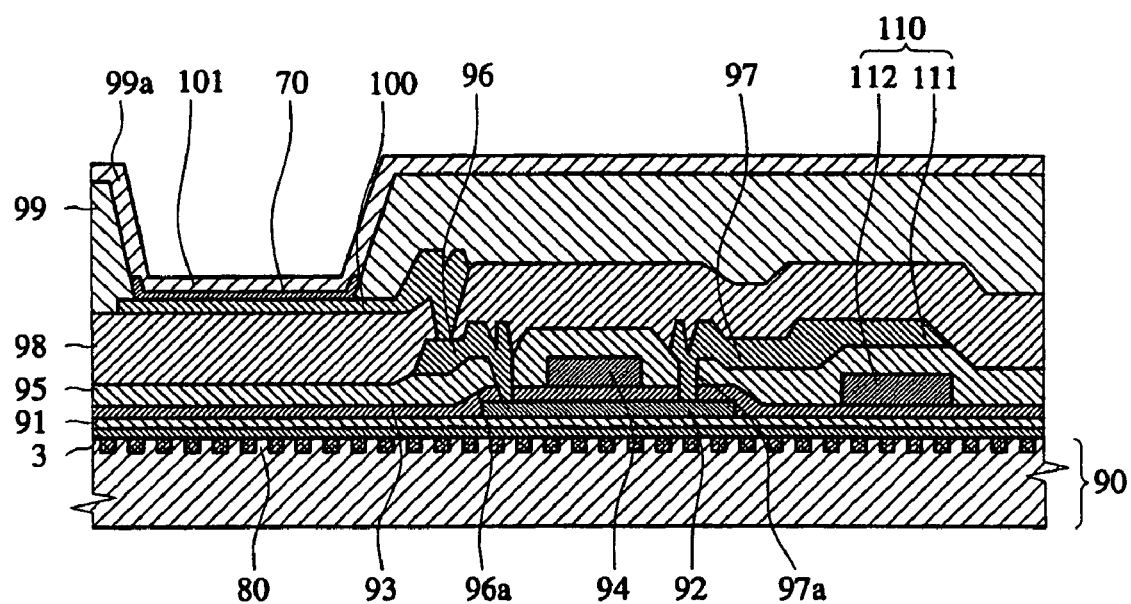

At this time, the position where the grooves 80 is to be formed is not limited to the embodiment and may be between layers with high refractive index. For example, the grooves layer 80 may be formed on the substrate 90 between the substrate 90 and the buffer layer 91, as shown in FIGS. 11 and 12.

As described above, in the organic electroluminescent device according to the present invention, it is possible to stably fabricate an organic electroluminescent device having a good luminescence property and high luminous efficiency by disposing at least one organic layer including an emitting layer between an anode and an cathode via an intermediate layer on a substrate having an optical element which is a diffraction grating, a scattering portion, a grating, or a polarizing filter.

What is claimed is:

1. An organic electroluminescent device, comprising:
   an intermediate layer on a substrate;
   an optical element comprising a diffraction grating and a planarization layer arranged between the substrate and the intermediate layer; and
   at least one organic layer including an emitting layer between an anode and a cathode, the anode formed over the optical element,
   wherein the diffraction grating comprises a groove arranged in the substrate, the groove having a linear surface that is substantially perpendicular to the substrate to diffract light,
   wherein the diffraction grating does not contact the intermediate layer, and
   wherein the intermediate layer is made of a material with a refractive index smaller than that of a material constituting the anode, and has a film thickness of 10 to 200 nm.

2. The device according to claim 1, wherein the intermediate layer is placed on the optical element within a thickness of 50 nm from the optical element.

3. The device according to claim 1, wherein the intermediate layer is disposed between the substrate with the optical element thereon and the anode.

4. The device according to claim 1, wherein the material forming the intermediate layer is a material equal to or different from the material constituting the optical element, and a transmittance of the intermediate layer is 70% or more, the transmittance being a transmittance at a wavelength of 630 nm of quartz glass with the material of the intermediate layer formed in a thickness of 200 nm.

5. The device according to claim 1, wherein the material forming the intermediate layer is any one of silicon oxide ($SiO_2$), titanium oxide ($TiO_2$), indium tin oxide (ITO), zinc oxide ($ZnO_2$), zirconium dioxide ($ZrO_2$), tantalum pentoxide ($Ta_2O_5$), alumina ($Al_2O_3$), and thin film diamond.

6. The device according to claim 1, wherein the intermediate layer is formed by a spin coating method.

7. The device according to claim 1, wherein a surface of the planarization layer with which the intermediate layer is adhered is subject to a planarization process, the planarization process being any one of a polishing process and a reactive ion etching process.

8. The device according to claim 1, wherein the optical element is formed from two types of materials with different refractive indexes, a difference between the refractive indexes of the two types of materials being 0.3 or more.

9. An organic electroluminescent device, comprising:
an intermediate layer on a substrate;
an optical element comprising a diffraction grating and a planarization layer arranged between the substrate and the intermediate layer; and
at least one organic layer including an emitting layer between an anode and a cathode, the anode formed over the optical element,
wherein the diffraction grating comprises a groove arranged in the substrate, the groove having a linear surface that is substantially perpendicular to the substrate to diffract light,
wherein the diffraction grating does not contact the intermediate layer, and
wherein the refractive index of the material constituting the intermediate layer is equal to or larger than that of the material constituting the anode, and the film thickness of the intermediate layer is 300 nm or less.

10. An organic electroluminescent device, comprising:
a substrate having a coarse surface to scatter light;
a planarization layer on the coarse surface of the substrate;
an intermediate layer arranged on the planarization layer; and
at least one organic layer having an emitting layer and arranged between an anode and a cathode, the anode being arranged on an optical element including the coarse surface,
wherein the intermediate layer is made of a material with a refractive index smaller than that of a material constituting the anode, and has a film thickness of 10 to 200 nm.

11. An organic electroluminescent device, comprising:
a substrate having a coarse surface to scatter light;
a planarization layer on the coarse surface of the substrate;
an intermediate layer arranged on the planarization layer; and
at least one organic layer having an emitting layer and arranged between an anode and a cathode, the anode being arranged an optical element including the coarse surface,
wherein the refractive index of the material constituting the intermediate layer is equal to or larger than that of the material constituting the anode, and the film thickness of the intermediate layer is 300 nm or less.

* * * * *